United States Patent [19]

Baker et al.

[11] 3,851,245

[45] Nov. 26, 1974

[54] METHOD FOR DETERMINING WHETHER HOLES IN INSULATED LAYER OF SEMICONDUCTOR SUBSTRATE ARE FULLY OPEN

[75] Inventors: Theodore H. Baker, Wappingers Falls; Richard C. Stevens, Poughkeepsie; Albert J. Tzou, Wappingers Falls, all of N.Y.

[73] Assignee: International Business Machines Corporation, Armonk, N.Y.

[22] Filed: Dec. 26, 1973

[21] Appl. No.: 427,972

[52] U.S. Cl. .................. 324/65 R, 29/574, 324/51, 324/62, 324/158 R

[51] Int. Cl. .................. G01r 27/02

[58] Field of Search.... 324/51, 62, 64, 65 R, 158 R; 29/574, 610

[56] References Cited

UNITED STATES PATENTS

| | | | |
|---|---|---|---|
| 3,465,427 | 9/1969 | Barson et al. | 29/574 |
| 3,609,537 | 9/1971 | Healy et al | 324/64 |
| 3,781,670 | 12/1973 | McMahon, Jr. | 324/158 R X |
| 3,796,947 | 3/1974 | Harrod et al. | 324/51 |
| 3,808,527 | 4/1974 | Thomas | 324/65 R |

*Primary Examiner*—Stanley T. Krawczewicz
*Attorney, Agent, or Firm*—Frank C. Leach, Jr.; J. B. Kraft

[57] ABSTRACT

A non-destructive test determines whether the holes in an insulated layer on a semiconductor wafer are fully open to provide communication through the insulated layer to the wafer. A conductor extends from each hole to another hole. Current is supplied to a plurality of these conductors in series to enable the resistance to be measured with the current having to flow through the surface of the wafer from the end of one conductor within the hole to the end of another conductor within the hole since the ends are spaced from each other. If any hole is not fully open, then the insulated layer prevents the flow of current to indicate by a high resistance that this portion of the wafer is not satisfactory.

8 Claims, 4 Drawing Figures

METHOD FOR DETERMINING WHETHER HOLES IN INSULATED LAYER OF SEMICONDUCTOR SUBSTRATE ARE FULLY OPEN

In the formation of transistors in a semiconductor wafer, for example, holes are formed in the insulated layer on the wafer and within which metal is to be deposited to form electrodes by making ohmic contact with the surface of the wafer. After the holes have been formed in the insulated layer, metal is deposited over the entire surface of the wafer so as to extend into the holes to make ohmic contacts with the wafer. The metal is then etched to form the various electrical connections for the wafer.

If the electrical connections are not properly made, the chip formed by this portion of the wafer will not be satisfactory and must be discarded after the chips are formed by dicing the wafer. While the etching of the metal to form the pattern of the conductors may cause the chip to be unsatisfactory, the possibility also exists that the reason for the chip not passing the various tests to which it is subjected after the formation of the electrodes is that one or more of the holes in the insulated layer may not have been completely open. That is, when etching the holes in the insulated layer of silicon dioxide, for example, on a silicon wafer, the possibility exists that one or more holes may not have been etched completely through the insulated layer because of insufficient etch time, defects in the mask used to define the hole, or improper prior processing.

If this failure of the hole or holes to communicate through the insulated layer to the surface of the wafer could be ascertained prior to the steps for producing the metallic electrodes, a determination could be made as to whether to continue manufacturing the particular wafer depending on the cost of the prior processing steps in comparison with the number of faulty chips, which will be formed from the wafer. Thus, the cost of manufacture of semiconductor chips could be reduced since the wafer having the chips could be discarded, if such is to occur, at an earlier stage than is presently available.

The present invention satisfactorily solves this problem by providing a method for detecting if any of the holes in the insulated layer are not fully open so that metal electrodes cannot make ohmic contact with the wafer surface. The present invention is a non-destructive test so that further processing of the semiconductor wafer can occur if the holes in the insulated layer are fully open or the number of faulty chips on the wafer is small in comparison with the cost of the prior processing steps.

The present invention accomplishes this through depositing a layer of metal over the wafer and then etching the metal to form various conductors with each conductor extending between two of the holes. For the various conductors to be connected in series, it is necessary for each of the conductors to have each of its ends extending into two different holes and making ohmic contact with the surface of the wafer. Furthermore, the holes must be fully open since the ends of the two conductors are spaced from each other and require the current to flow through the wafer for the current to be able to flow between the two terminals, which are at the ends of the series connected conductors to which a voltage or a constant current source is applied.

When either a voltage or a constant current source is applied between the two terminals at the ends of the series connected conductors, this enables the resistance between the two terminals to be determined. When a voltage is used, it should be kept less than 0.5 volt to prevent any undesirable parasitic effects such as shunt current through a barrier junction, for example. The absence of current, as obtained by an ammeter, shows that an unopened hole exists as the resistance would be near infinity.

If a constant current source is used, an approximate value of the acceptable maximum resistance must be known. With this acceptable maximum resistance, the selected current applied should be less than that which will produce a voltage of 0.5 volt with a multiple of the acceptable maximum resistance to avoid any undesirable parasitic effects. When a voltage reading is greater than the product of the applied current and the acceptable maximum resistance, this indicates that an unopened hole exists as the resistance would be near infinity. Of course, the voltage for the constant current souce could only rise to its clamp voltage, which must be set greater than the product of the selected current and the multiple of the acceptable maximum resistance.

In addition to being able to test whether the holes in the insulated layer for metallic electrodes are fully open, the method of the present invention also may be employed to test whether the holes are open in an insulated layer to enable diffusion, for example, of impurities into the wafer. Thus, if one of the holes in the insulated layer was not fully open, then there would not be diffusion of an impurity in the desired region, and this also would cause the chip formed in this portion of the wafer to be unsatisfactory. Thus, the method of the present invention enables testing at any stage of the processing of a semiconductor wafer to form chips in which it is desired to ascertain that the holes in the insulated layer are fully open so that there is communication to the surface of the wafer through each of the holes in the insulated layer.

An object of this invention is to provide a test for detecting if each of the holes in an insulated layer of a semiconductor wafer is fully open.

Another object of this invention is to provide a nondestructive test for ascertaining if each of the holes in an insulated layer on a semiconductor wafer is fully open to enable metal to extend therethrough to the surface of the wafer.

The foregoing and other objects, features, and advantages of the invention will be more apparent from the following more particular description of a preferred embodiment of the invention as illustrated in the accompanying drawing.

Figure 1:
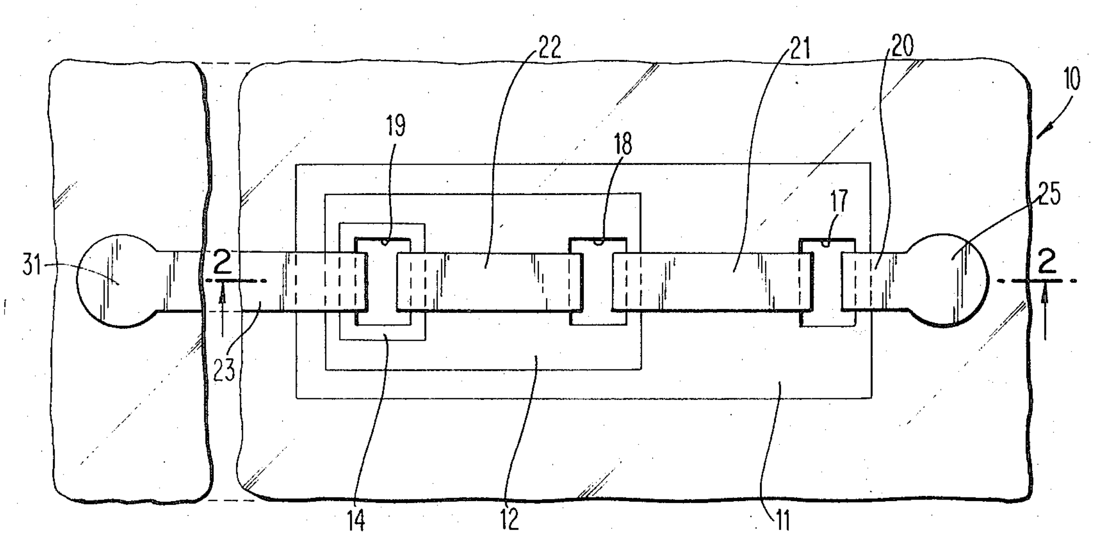
FIG. 1 is a fragmentary top plan view of a portion of a semiconductor wafer showing the arrangement of series connected conductors used in the method of the present invention for testing to determine if each of the holes in an insulated layer on the semiconductor wafer is fully open.

Referring to the drawing and particularly FIG. 1, there is shown a semiconductor wafer 10 having a collector region 11, a base region 12, and an emitter region 14 to form a transistor. The wafer 10 is preferably formed of silicon. While only one transistor has been shown on the wafer 10, it should be understood that the wafer 10 would have many transistors and various other components, active and/or passive, thereon and that the wafer 10 is diced at the completion of processing to form a plurality of chips having integrated circuits.

An insulated layer 15, which could be formed of silicon dioxide, for example, when the wafer 10 is formed of silicon, is shown disposed on a top surface 16 of the wafer 10. A plurality of holes 17, 18, and 19 is formed in the insulated layer 15 to provide communication therethrough to the collector region 11, the base region 12, and the emitter region 14, respectively, in the wafer 10 for metal to make ohmic contact with the regions 11, 12, and 14.

With the holes 17, 18, and 19 formed in the insulated layer 15, the method of the present invention is employed to determine if each of the holes 17, 18, and 19 is fully open so as to provide communication to the collector region 11, the base region 12, and the emitter region 14, respectively, through the insulated layer 15. Accordingly, a suitable electrically conductive material such as aluminum, for example, is deposited over the insulated layer 14 and into the holes 17, 18, and 19. Then, the material is etched to form a plurality of conductors such as conductors 20, 21, 22, and 23, for example.

The conductor 20 has one end 24 extending through the hole 17 and into ohmic contact with the collector region 11 of the wafer 10. The conductor 20 can have its other end either disposed in a hole (not shown) in the insulated layer 15 to ohmically contact another portion of the top surface 16 of the wafer 10 or to a terminal 25 (see FIG. 1).

The conductor 21 has one end 26 extending through the hole 17 and into ohmic contact with the collector region 11. The end 26 of the conductor 21 is spaced from the end 24 of the conductor 20 so that current flow between the end 24 of the conductor 20 and the end 26 of the conductor 21 must be through the collector region 11.

The conductor 21 has its other end 27 extending through the hole 18 and into ohmic contact with the base region 12 of the wafer 10. The conductor 22 has one end 28 extending into the hole 18, which has the end 27 of the conductor 21 extending thereinto, and ohmically contacting the base region 12. The end 28 of the conductor 22 is spaced from the end 27 of the conductor 21 so that current flow between the end 27 of the conductor 21 and the end 28 of the conductor 22 must be through the base region 12.

The conductor 22 has its other end 29 extending through the hole 19 and into ohmic contact with the emitter region 14. The conductor 23 has one end 30 extending into the hole 19 for ohmic contact with the emitter region 14 but spaced from the end 29 of the conductor 22. Accordingly, current flow between the end 29 of the conductor 22 and the end 30 of the conductor 23 must be through the emitter region 14 of the wafer 10.

The other end of the conductor 23 can extend into another hole in the insulated layer 15 to make ohmic contact with another region of the wafer 10 or can extend into engagement with a terminal 31 (see FIG. 1). It should be understood that the terminals 25 and 31 would not be connected to just the conductors with the three regions 11, 12, and 14 of the wafer 10 but would be connected in series with a plurality of conductors cooperating with other regions in the wafer 10 with the series connected conductors normally being on a portion of the wafer 10 forming one chip. Thus, while the terminal 25 has been shown in FIG. 1 at the end of the conductor 29, the terminal 31 does not contact the conductor 23. It also should be understood that a plurality of sets of the terminals 25 and 31 are required to test the portion of the wafer 10 forming one chip.

Figure 2:
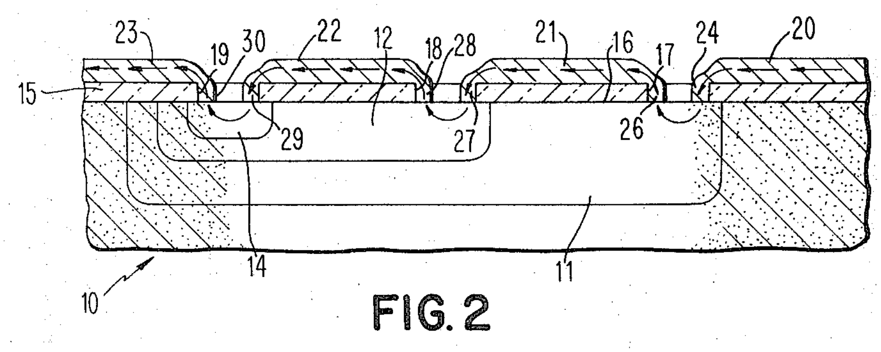
FIG. 2 is an enlarged sectional view of the wafer of FIG. 1 and taken along line 2—2 of FIG. 1 to show the disposition of the conductors when the holes in the insulated layer on the wafer are fully open.

With each of the holes 17, 18, and 19 being fully open as shown in FIG. 2, the resistance between the terminals 25 and 31 can be obtained by causing flow of current therebetween through the conductors by the application of a DC voltage between the terminals 25 or 31 or a constant current source at one of the terminals 25 and 31. Thus, between the terminals 25 and 31, current would flow in series from the terminal 25 through the conductor 20, the collector region 11, the conductor 21, the base region 12, the conductor 22, the emitter region 14, the conductor 23 and then to the terminal 31 after flowing through other of the conductors and the regions on a portion of the wafer 10. With all of the holes being fully open as shown in FIG. 2, there would be no interruption of the current flow in the series connected conductors so that this portion of the wafer 10 would be satisfactory.

Figure 3:
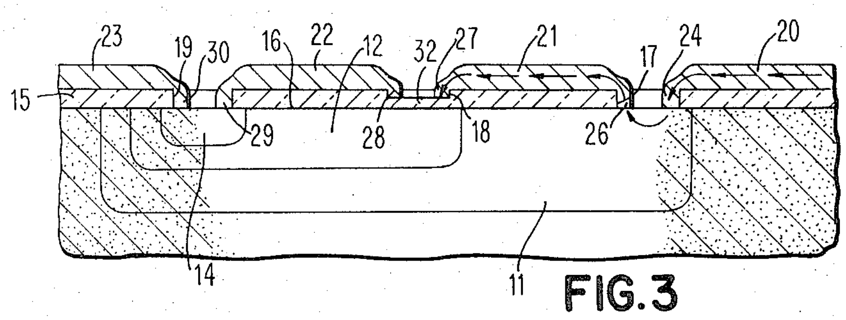
FIG. 3 is a view, similar to FIG. 2, but showing the disposition of the conductors with one of the holes in the insulated layer on the wafer fully closed.

As shown in FIG. 3, the hole 18 is blocked by a portion 32 of the insulated layer 15. The portion 32 could have resulted from the etchant not penetrating due to the thickness of the layer 15 at this location, for example, exceeding that expected.

As a result, neither the end 27 of the conductor 21 nor the end 28 of the conductor 22 engages the base region 12 of the wafer 10. As a result, current cannot flow between the end 27 of the conductor 21 and the end 28 of the conductor 22. Accordingly, there would be no current flow between the terminals 25 and 31. Thus, this resistance test would indicate that this portion of the wafer 10 is not satisfactory since it would have too high of a resistance.

If the voltage applied between the terminals 25 and 31 were to exceed 0.5 volt, a shunt current could flow between the collector region 11, the base region 12, and the emitter region 14 through their junction barriers so that the series current flow, as measured by an ammeter, would seem to exist between the terminals 25 and 31. Therefore, the voltage must be selected so that it will not produce this shunt current.

If the constant current source is supplied at one of the terminals 25 and 31, an approximate value of the acceptable maximum resistance therebetween must be known. With this acceptable maximum resistance, the applied current must be less than that which will produce a voltage of 0.5 volt with a multiple, such as two, for example, of the acceptable maximum resistance.

When a voltage reading is greater than the product of the applied current and the acceptable maximum resistance, this indicates that an unopened hole exists, and the current is being shunted through the collector region 11, the base region 12, and the emitter region 14 by passing through the junction barriers. The voltage for the constant current source can only rise to its clamp voltage, which must be greater than the product of the selected current and the multiple of the acceptable maximum resistance. If the current magnitude were not so selected, the current would be shunted through the collector region 11, the base region 12, and the emitter region 14 by passing through the junction barriers when a defect exists to give a false determination.

Thus, when the voltage is applied, it must be sufficiently low that it will not breakdown the junction barrier between the regions of opposite conductivities. When the constant current source is used, the current magnitude is selected in conjunction with a multiple of the acceptable maximum resistance of the portion of the wafer 10 through which it passes so that the current will not flow through the junction barrier between the regions of opposite conductivities if no defect exists.

Figure 4:
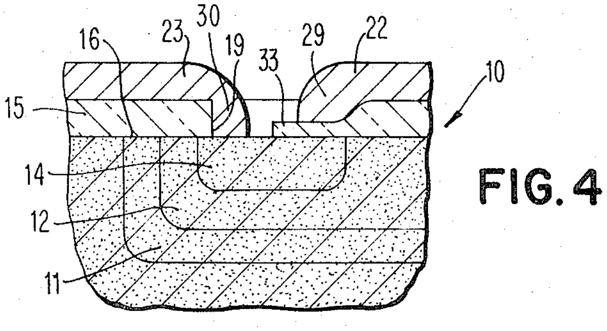
FIG. 4 is an enlarged fragmentary sectional view of a portion of the wafer of FIG. 1 in which a hole in the insulated layer on the semiconductor wafer is partially open.

As shown in FIG. 4, the hole 19 for the emitter region 14 is partially closed by a thin portion 33 of the insulated layer 15. When this occurs, the end 30 of the conductor 23 can engage the emitter region 14 of the wafer 10, but the end 29 of the conductor 22 is prevented from engaging the emitter region 14.

Thus, even though the hole 19 is partially open, it is not sufficiently open to enable the desired ohmic contact between the emitter electrode and the emmiter region 14. Therefore, when the insulated layer 15 has a hole partially open as shown for the hole 19 in FIG. 4, the measurement of the resistance between the terminals 25 and 31 by the application of a voltage between the terminals 25 and 31 or a constant current source at one of the terminals 25 and 31 again does not produce a current flow therebetween because of the end 29 of the conductor 22 not making ohmic contact with the emitter region 14.

After testing, the conductor may be removed in the same manner as it was formed. For example, immersing the wafer in a dilute solution of sodium hydroxide when the conductor is formed of aluminum will remove the conductor.

While the present invention has shown and described the method of testing as being applied to the wafer 10 after the insulated layer 15 has the collector region 11, the base region 12, and the emitter region 14 formed therein along with all of the other active and passive components so that the wafer 10 is ready for a level of metallization, it should be understood that the test could be employed at other processing stages of the wafer 10. For example, during the diffusion of each of the impurities through the insulated layer 15 to form the collector region 11, the base region 12, and the emitter region 14, the same type of test could be performed with the conductors extending between the holes formed in the insulated layer 15 for the diffusion of the particular impurity.

While the present invention has shown and described only two of the terminals 25 and 31 for testing holes for a plurality of active and/or passive components on the wafer 10, it should be understood that the wafer 10 wsuld normally have a plurality of the various series connected conductors with separate terminals to which the voltage or constant current source would be applied. The voltage or constant current source would be applied to the various terminals at different times during the test.

An advantage of this invention is that the failure of a semiconductor wafer due to the holes in the insulated layer not communicating with the wafer surface can be ascertained at an earlier manufacturing stage than after the metallic electrodes have been formed. Another advantage of this invention is that it is a non-destructive test.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method of determining whether each of the holes in an insulated layer on a surface of a semiconductor wafer is fully open to communicate with the surface of the wafer including:

forming conductors on the insulated layer from one hole to another with one end of each of the conductors being disposed to extend to the region of the surface of the wafer with which the one hole is to communicate to make ohmic contact therewith and the other end of the conductor being disposed to extend to the region of the surface of the wafer with which the other hole is to communicate to make ohmic contact therewith so that each of the holes has the ends of two conductors extending therethrough to a region of the wafer and spaced from each other;

applying a voltage across a plurality of series connected conductors;

and ascertaining the total resistance of the current path by the current that flows through all the series connected conductors to determine that all of the holes in the insulated layer having the ends of the conductors extending thereinto communicate with the surface of the wafer at the various regions.

2. The method according to claim 1 in which the conductors are formed by depositing a conductive material over the insulated layer and into the holes in the insulated layers and then etching portions of the conductive material to form the conductors with each of the conductors having material removed to leave a space within each of the holes between the ends of the conductors adapted to engage the region of the wafer.

3. The method according to claim 2 in which the holes provide communication to regions of the wafer forming the emitter, base, and collector of at least one transistor in the wafer.

4. The method according to claim 3 in which the wafer is silicon.

5. The method according to claim 4 including removing the conductors upon completion of testing.

6. The method according to claim 3 including removing the conductors upon completion of testing.

7. The method according to claim 2 in which the wafer is silicon.

8. The method according to claim 1 in which the wafer is silicon.

* * * * *